US012695651B2

(12) United States Patent
Eitan et al.

(10) Patent No.: US 12,695,651 B2
(45) Date of Patent: Jul. 28, 2026

(54) HIGH SPEED TX TOPOLOGY WITH A COMMON MODE CONTROLLED SERIALIZATION STAGE EMBEDDED IN AN OUTPUT STAGE

(71) Applicant: RETYM INC., Cupertino, CA (US)

(72) Inventors: Roee Eitan, Haifa (IL); Yaakov Dayan, Jerusalem (IL); Yosi Sanhedrai, Beit Shemesh (IL); Aviv Berg, Beit Keshet (IL); Esther T. Fridman, Jerusalem (IL); Kirill Blum, Nesher (IL); Or Adiv, Givatayim (IL); Avi Miller, Rosh HaAyin (IL)

(73) Assignee: Retym Inc., Cupertino, CA (US)

( * ) Notice: Subject to any disclaimer, the term of this patent is extended or adjusted under 35 U.S.C. 154(b) by 0 days.

(21) Appl. No.: 18/861,284

(22) PCT Filed: May 10, 2023

(86) PCT No.: PCT/US2023/021752
§ 371 (c)(1),
(2) Date: Oct. 29, 2024

(87) PCT Pub. No.: WO2023/220190
PCT Pub. Date: Nov. 16, 2023

(65) Prior Publication Data
US 2025/0286758 A1      Sep. 11, 2025

Related U.S. Application Data

(60) Provisional application No. 63/340,370, filed on May 10, 2022.

(51) Int. Cl.
*H04L 25/49*          (2006.01)
*H03K 19/094*      (2006.01)

(52) U.S. Cl.
CPC ........... *H04L 25/49* (2013.01); *H03K 19/094* (2013.01)

(58) Field of Classification Search
CPC ....... H04L 25/49; H04L 25/02; H03K 19/094; H03K 19/0944; G06F 1/04; H03M 1/66; H03M 9/00
See application file for complete search history.

(56) References Cited

U.S. PATENT DOCUMENTS 6,650,141 B2 * 11/2003 Agrawal .......... H03K 19/17744
                                                          326/101
6,680,681 B1 *  1/2004 Hsu ..................... H04L 25/0288
                                                          341/120
(Continued)

FOREIGN PATENT DOCUMENTS

CA          2308493 A1 *  7/1999  ........... H04L 25/028
CN          1913365 A  *  2/2007  .............. H03M 9/00
(Continued)

OTHER PUBLICATIONS

Celik et al.: "JESD204B Compliant 12.5 GB/s LVDS and SST Transmitters in 28 nm FD-SOI CMOS", 2019 15TH Conference On PH. D Research in Microelectronics and Electronics (Prime) IEEE, Jul. 15, 2019 (Jul. 15, 2019), pp. 101-104, XP033590794, DOI: 10.1109/PRIME.2019.8787786.
(Continued)

*Primary Examiner* — Berhanu Tadese
(74) *Attorney, Agent, or Firm* — Meitar Patents LTD.; Daniel Kligler

(57)                    ABSTRACT
A high-speed transmitter system using a common mode controlled serialization stage embedded in an output stage is disclosed. In some embodiments, the transmitter includes a serialization circuit that is configured to convert parallel data into serial data with one or more serialization stages; a logic circuit that is configured to connect each input of a last stage
(Continued)

of the one or more serialization stages of the serialization circuit, via a respective logic function, to a respective dedicated output stage of an output circuit; and the output circuit that is configured to implement output stages to generate a signal based on the received input using NMOS transistors. In addition, the logic circuit is configured to be a desired voltage value (e.g., the output circuit's common mode) such that a switching point of the NMOS gm stage can be decreased and the gm stage can be activated within a reduced time.

16 Claims, 5 Drawing Sheets

(56)                References Cited

U.S. PATENT DOCUMENTS

| | | | | |
|---|---|---|---|---|
| 7,249,273 | B2 * | 7/2007 | Zhao | H03M 9/00 |
| | | | | 713/400 |
| 7,406,101 | B1 * | 7/2008 | Obeidat | H03K 5/135 |
| | | | | 370/371 |
| 7,471,107 | B1 | 12/2008 | Fortin et al. | |
| 7,535,957 | B2 * | 5/2009 | Ozawa | H03L 7/113 |
| | | | | 348/530 |
| 7,809,026 | B1 * | 10/2010 | Obeidat | H03K 5/135 |
| | | | | 370/252 |
| 7,848,318 | B2 * | 12/2010 | Nguyen | H03K 19/00 |
| | | | | 370/542 |
| 8,225,017 | B1 * | 7/2012 | Tang | H03M 9/00 |
| | | | | 370/537 |
| 8,274,412 | B1 * | 9/2012 | Zhang | H03M 9/00 |
| | | | | 341/100 |
| 8,417,200 | B1 * | 4/2013 | Gomez | H04B 1/0475 |
| | | | | 330/250 |
| 8,570,197 | B2 * | 10/2013 | Nguyen | H03M 9/00 |
| | | | | 341/100 |
| 8,832,487 | B2 * | 9/2014 | Fiedler | G06F 1/10 |
| | | | | 713/502 |
| 8,912,933 | B1 * | 12/2014 | Zhang | H03M 9/00 |
| | | | | 341/101 |
| 9,071,293 | B1 * | 6/2015 | Venditti | H04B 1/0475 |
| 9,077,330 | B2 * | 7/2015 | Nguyen | H03M 9/00 |
| 9,118,367 | B2 * | 8/2015 | Gomez | H04B 1/0475 |
| 9,160,403 | B2 | 10/2015 | Suzuki et al. | |
| 9,219,470 | B1 * | 12/2015 | Venditti | H03K 5/1565 |
| 9,237,003 | B1 * | 1/2016 | Chengson | H04L 25/49 |
| 9,310,830 | B2 * | 4/2016 | Fiedler | H03K 19/018521 |
| 9,465,769 | B1 * | 10/2016 | Leong | G06F 11/076 |
| 9,509,339 | B2 * | 11/2016 | Petrucci | H04L 25/02 |
| 9,608,523 | B1 * | 3/2017 | Iwai | H03K 21/02 |
| 9,608,845 | B2 * | 3/2017 | Chong | H04L 25/03019 |
| 9,667,281 | B1 * | 5/2017 | Venditti | H04B 1/04 |
| 9,685,978 | B2 * | 6/2017 | Choi | H04L 25/4904 |
| 9,965,435 | B2 * | 5/2018 | Ladd | H03M 9/00 |
| 10,511,322 | B1 * | 12/2019 | Cattivelli | H03M 3/456 |
| 10,523,235 | B2 * | 12/2019 | Liu | H03M 13/09 |
| 10,560,097 | B1 * | 2/2020 | Peng | H04L 7/033 |
| 10,728,060 | B2 * | 7/2020 | Peng | H04L 25/03038 |
| 10,749,505 | B2 * | 8/2020 | Rao | H04J 3/06 |
| 10,784,845 | B2 * | 9/2020 | Doppalapudi | H03K 5/1565 |
| 10,784,906 | B2 | 9/2020 | Saeki | |
| 10,790,636 | B1 * | 9/2020 | Abdelhalim | H01S 5/0427 |
| 10,931,305 | B2 * | 2/2021 | Choi | H03K 5/135 |
| 10,951,250 | B1 * | 3/2021 | Abdelhalim | H01S 5/0427 |
| 11,005,690 | B1 * | 5/2021 | Cartina | G01R 13/345 |
| 11,240,079 | B1 * | 2/2022 | Kushnir | H04L 5/0044 |
| 11,309,876 | B2 * | 4/2022 | Doppalapudi | H04J 3/062 |
| 11,469,760 | B2 | 10/2022 | Ucar | |
| 11,824,695 | B2 * | 11/2023 | Valaee | H04L 27/01 |
| 11,894,655 | B2 * | 2/2024 | Abdelhalim | H01S 5/0427 |
| 12,003,233 | B1 * | 6/2024 | Tripathi | H03K 19/20 |
| 12,034,573 | B1 * | 7/2024 | Cartina | H04L 25/03859 |
| 12,111,786 | B2 * | 10/2024 | Kim | H03K 17/6874 |
| 12,113,499 | B2 * | 10/2024 | Gazzerro | H03M 1/66 |
| 12,113,538 | B2 * | 10/2024 | Doppalapudi | H03K 5/1565 |
| 12,182,051 | B1 * | 12/2024 | Bahadori | G06F 13/4063 |
| 12,449,478 | B2 * | 10/2025 | Singh | G01R 31/2851 |
| 2003/0076562 | A1 * | 4/2003 | Shin | H04L 7/04 |
| | | | | 398/139 |
| 2003/0112031 | A1 * | 6/2003 | Agrawal | H03K 19/17744 |
| | | | | 326/41 |
| 2005/0218941 | A1 | 10/2005 | Kushiyama et al. | |
| 2007/0127518 | A1 | 6/2007 | Liu et al. | |
| 2008/0168302 | A1 * | 7/2008 | Cagno | H04L 1/22 |
| | | | | 714/5.1 |
| 2008/0260049 | A1 * | 10/2008 | Wood | G06F 13/4072 |
| | | | | 375/257 |
| 2009/0319706 | A1 * | 12/2009 | Okazaki | H04L 25/4908 |
| | | | | 710/106 |
| 2010/0253389 | A1 | 10/2010 | Luich et al. | |
| 2011/0068845 | A1 * | 3/2011 | Nguyen | H03K 19/17744 |
| | | | | 327/293 |
| 2012/0072759 | A1 * | 3/2012 | Wu | H03M 9/00 |
| | | | | 713/401 |
| 2013/0007500 | A1 * | 1/2013 | Fiedler | G06F 1/10 |
| | | | | 713/501 |
| 2014/0016718 | A1 * | 1/2014 | Ravinuthula | H03L 7/18 |
| | | | | 375/295 |
| 2014/0372785 | A1 * | 12/2014 | Fiedler | G06F 1/10 |
| | | | | 713/501 |
| 2015/0343966 | A1 * | 12/2015 | Petrucci | H04L 25/0272 |
| | | | | 375/257 |
| 2015/0349733 | A1 * | 12/2015 | Chen | H03F 3/45475 |
| | | | | 330/258 |
| 2016/0006596 | A1 * | 1/2016 | Dickson | H04L 27/364 |
| | | | | 375/298 |
| 2016/0173274 | A1 * | 6/2016 | Choi | H04L 25/4904 |
| | | | | 375/362 |
| 2017/0077808 | A1 * | 3/2017 | Iwai | H03M 9/00 |
| 2017/0207946 | A1 * | 7/2017 | Dickson | H04L 27/364 |
| 2018/0287718 | A1 * | 10/2018 | Ucar | H03K 19/018521 |
| 2018/0343016 | A1 | 11/2018 | Dietrich | |
| 2020/0106649 | A1 * | 4/2020 | Peng | H04L 25/03343 |
| 2020/0220547 | A1 * | 7/2020 | Ucar | H03K 19/018521 |
| 2020/0321977 | A1 * | 10/2020 | Choi | H03K 17/6871 |
| 2021/0297294 | A1 * | 9/2021 | Cartina | H04L 25/03859 |
| 2022/0147482 | A1 * | 5/2022 | Kim | H03K 17/6872 |
| 2023/0109793 | A1 * | 4/2023 | Balan | H04L 7/0091 |
| | | | | 375/354 |
| 2023/0253975 | A1 | 8/2023 | Hsieh et al. | |
| 2023/0275792 | A1 * | 8/2023 | Valaee | H04L 25/03878 |
| | | | | 375/232 |
| 2023/0318886 | A1 * | 10/2023 | Kumar | H04L 25/03146 |
| | | | | 375/233 |
| 2025/0286758 | A1 * | 9/2025 | Eitan | H04L 25/49 |
| 2025/0309920 | A1 * | 10/2025 | Huang | H03M 13/27 |
| 2025/0330349 | A1 * | 10/2025 | Eitan | H04L 25/49 |

FOREIGN PATENT DOCUMENTS

| | | | | | |
|---|---|---|---|---|---|
| CN | 100571101 | C | * | 12/2009 | H04B 7/0465 |
| CN | 1913365 | B | * | 8/2011 | H03M 9/00 |
| CN | 102355270 | A | * | 2/2012 | H03M 9/00 |
| CN | 102355270 | B | * | 1/2015 | H03M 9/00 |
| CN | 106209068 | A | * | 12/2016 | H03K 19/0185 |
| CN | 108292924 | A | * | 7/2018 | G06F 13/4282 |
| CN | 106209068 | B | * | 4/2019 | H03K 19/094 |
| CN | 111061664 | A | * | 4/2020 | H03F 3/45475 |
| CN | 111064473 | A | * | 4/2020 | H03K 19/018521 |
| CN | 111342835 | A | * | 6/2020 | H03K 19/0175 |
| CN | 112019176 | A | * | 12/2020 | H03K 5/15 |
| CN | 114968878 | A | * | 8/2022 | H03M 1/66 |
| CN | 112019194 | B | * | 1/2023 | H03K 5/15 |
| CN | 115550116 | B | * | 3/2023 | H04L 25/03025 |
| CN | 111064473 | B | * | 4/2023 | |
| CN | 118631237 | A | * | 9/2024 | H03K 19/00315 |
| CN | 118631237 | B | * | 12/2024 | H03K 19/00315 |
| CN | 119156771 | A | * | 12/2024 | H03K 19/0944 |
| CN | 119256281 | A | * | 1/2025 | H03K 19/094 |
| CN | 120200619 | A | * | 6/2025 | H03K 19/173 |

(56) References Cited

FOREIGN PATENT DOCUMENTS

| | | | | | |
|---|---|---|---|---|---|
| CN | 120303877 | A | * | 7/2025 | .............. H04B 1/04 |
| DE | 69930371 | T2 | * | 11/2006 | ......... H04L 25/0278 |
| DE | 60309462 | T2 | * | 8/2007 | ............. H03M 9/00 |
| DE | 102020000629 | A1 | * | 8/2020 | ............. H04B 1/04 |
| DE | 102022201749 | A1 | * | 8/2022 | ............. H03M 1/66 |
| DE | 102020000629 | B4 | * | 10/2024 | ........... H03M 3/508 |
| EP | 1050138 | B1 | * | 3/2006 | ........... H04L 25/028 |
| EP | 1753142 | A2 | * | 2/2007 | ....... H03K 19/17744 |
| EP | 1753142 | B1 | * | 8/2012 | ....... H03K 19/17744 |
| EP | 3319249 | A1 | * | 5/2018 | ....... H04L 12/40045 |
| EP | 3375097 | B1 | * | 6/2020 | ............. H03M 9/00 |
| EP | 3319249 | B1 | * | 10/2021 | ............. H04L 7/10 |
| EP | 4576684 | A1 | * | 6/2025 | .......... H03K 19/173 |
| GB | 2387248 | A | * | 10/2003 | ....... H03K 19/17744 |
| JP | H05204373 | A | * | 8/1993 | .............. G09G 5/14 |
| JP | 2002510166 | A | * | 4/2002 | ........ H04L 25/0292 |
| JP | 2007043716 | A | * | 2/2007 | ............ H03K 19/00 |
| JP | 4344475 | B2 | * | 10/2009 | ........ H04L 25/0292 |
| JP | 2018533791 | A | * | 11/2018 | ........ G06F 13/4027 |
| JP | 2025516071 | A | * | 5/2025 | .......... H03K 19/094 |
| JP | 2025516776 | A | * | 5/2025 | ........ H03K 19/0944 |
| KR | 20010034228 | A | * | 4/2001 | ........ H04L 25/0278 |
| KR | 100687669 | B1 | * | 2/2007 | ........ H04L 25/0292 |
| KR | 20090077421 | A | * | 7/2009 | .............. H04L 7/04 |
| KR | 20150027523 | A | * | 3/2015 | ............. H03M 1/00 |
| KR | 101828104 | B1 | * | 3/2018 | .............. H03L 7/00 |
| KR | 20200117634 | A | * | 10/2020 | .......... H03K 5/1504 |
| KR | 102240281 | B1 | * | 4/2021 | ........ H04L 25/0222 |
| KR | 102624454 | B1 | * | 1/2024 | .......... H03K 5/1504 |
| KR | 20250025622 | A | * | 2/2025 | ........ H03K 19/0944 |
| KR | 20250026167 | A | * | 2/2025 | .......... H03K 19/094 |
| KR | 20250114628 | A | * | 7/2025 | .......... H03K 19/017 |
| RU | 113101 | U1 | * | 1/2012 | |
| TW | I687046 | B | * | 3/2020 | ........ H03F 3/45475 |
| TW | 202013887 | A | * | 4/2020 | ....... H04L 25/03038 |
| TW | 202404275 | A | * | 1/2024 | ........ H03K 19/0944 |
| TW | 202409775 | A | * | 3/2024 | .......... H03K 19/094 |
| WO | WO-9937067 | A1 | * | 7/1999 | ........... H04L 25/028 |
| WO | WO-0193491 | A2 | * | 12/2001 | ............ H03L 7/085 |
| WO | WO-03036825 | A1 | * | 5/2003 | ............... H04L 7/04 |
| WO | WO-2007033305 | A2 | * | 3/2007 | ......... H04L 25/0266 |
| WO | WO-2009121186 | A1 | * | 10/2009 | ....... H04N 21/23602 |
| WO | WO-2017083047 | A1 | * | 5/2017 | .......... G06F 13/385 |
| WO | WO-2020068533 | A1 | * | 4/2020 | ............... H03K 5/05 |
| WO | WO-2021101973 | A1 | * | 5/2021 | .......... H03K 5/1565 |
| WO | WO-2023220190 | A2 | * | 11/2023 | .......... H03K 19/094 |
| WO | WO-2023225574 | A1 | * | 11/2023 | ........ H03K 19/0944 |
| WO | WO-2024137157 | A1 | * | 6/2024 | .............. H04B 1/04 |
| WO | WO-2025159343 | A1 | * | 7/2025 | .......... H03K 19/017 |

OTHER PUBLICATIONS

G. Balamurugan et al.: "A Scalable 5-15 Gbps, 14-75 mW Low-Power I/O Transceiver in 65 nm CMOS", IEEE Journal of Solid-State Circuits IEEE, USA, vol. 43, No. 4, Apr. 1, 2008 (Apr. 1, 2008), pp. 1010-1019, XP011206676, ISSN: 0018-9200, DOI: 10.1109/JSSC.2008.917522.

European Examination Report (Form 1507), EP Application No. 23 808 555.9, dated Apr. 2, 2026.

Notice of References Cited, U.S. Appl. No. 18/865,707, dated Mar. 26, 2026.

Non-Final Office Action, U.S. Appl. No. 18/865,707, filed Mar. 26, 2026.

European Search Report, Application No. EP 23 80 8555, Apr. 2, 2026.

Razavi Behzad, "Design Techniques for High-Speed Wireline Transmitters", IEEE Open Journal of the Solid-State Circuits Society, vol. 1, dated Sep. 13, 2021, pp. 53-66, DOI: 10.1109/OJSSCS.2021.3112398.

Supplementary European Search Report, Application No. EP23804217, dated Apr. 22, 2026.

EPO communication cf Form 1507, European patent application No. EP23804217, dated Apr. 22, 2026.

* cited by examiner

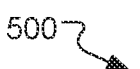

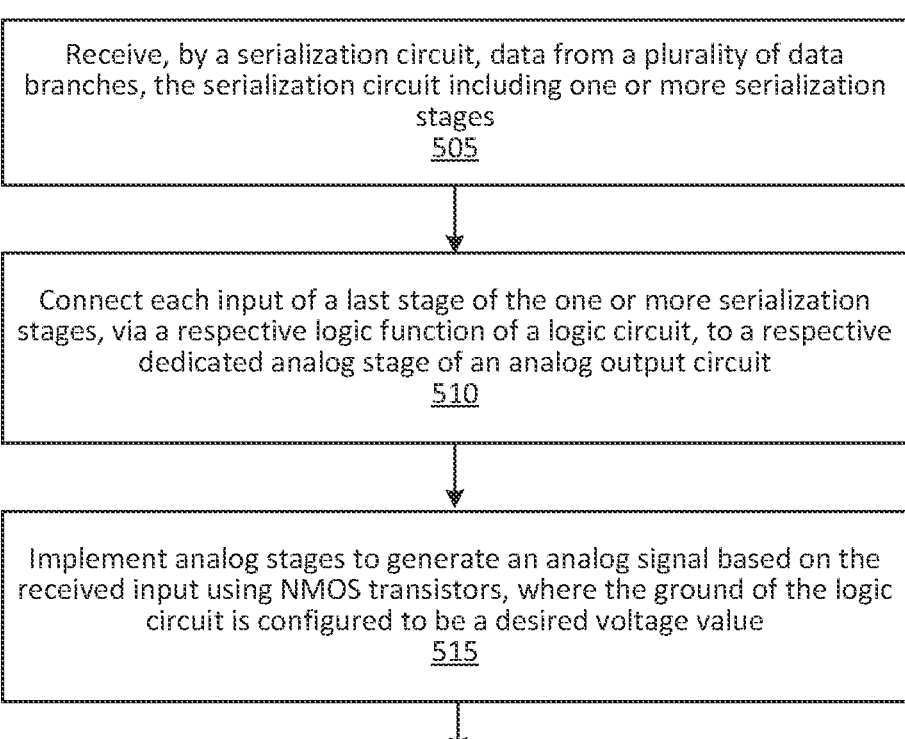

Receive, by a serialization circuit, data from a plurality of data branches, the serialization circuit including one or more serialization stages
505

Connect each input of a last stage of the one or more serialization stages, via a respective logic function of a logic circuit, to a respective dedicated analog stage of an analog output circuit
510

Implement analog stages to generate an analog signal based on the received input using NMOS transistors, where the ground of the logic circuit is configured to be a desired voltage value
515

FIG. 5

HIGH SPEED TX TOPOLOGY WITH A COMMON MODE CONTROLLED SERIALIZATION STAGE EMBEDDED IN AN OUTPUT STAGE

CROSS REFERENCE TO RELATED APPLICATION

This application claims the benefit of U.S. Provisional Patent Application No. 63/340,370, titled "High Speed Tx Topology with a Common Mode Controlled Serialization Stage Embedded in the Output Stage" and filed May 10, 2022, the entire contents of which are incorporated by reference herein.

TECHNICAL FIELD

This disclosure relates to a transmitter system using a common mode controlled serialization stage embedded in an output stage that enables fast operation and high reliability.

BACKGROUND

Transmitter (Tx) is an important component of a physical layer communication system. It is electronic component that converts a digital signal from an encoder into an analog signal that can travel through a transmission medium (e.g., wire, wireless channel) and be received by a receiver (Rx). Data transmitted by a Tx is often generated by a logic portion. Typically, the logic portion generates data at a much lower speed than the data rate that the Tx can handle. Therefore parallel-in, serial-out (PISO) conversion is widely used in Tx to achieve the required data rate. Serialization is commonly implemented by a chain of multiplexers (mux) to output a single signal with a high frequency. However, this topology (especially the last mux) has a significant speed limitation, and thus can barely or cannot satisfy the speed requirement of cutting-edge Tx systems.

SUMMARY

To address the aforementioned shortcomings, a high-speed transmitter system using a common mode controlled serialization stage embedded in an output stage is disclosed. In some embodiments, the transmitter includes a serialization circuit that is configured to convert parallel data into serial data with one or more serialization stages; a logic circuit that is configured to connect each input of a last stage of the one or more serialization stages of the serialization circuit, via a respective logic function, to a respective dedicated output stage of an output circuit; and the output circuit that is configured to implement output stages to generate a signal based on the received input using NMOS transistors. In addition, the logic circuit is configured to be a desired voltage value (e.g., the output circuit's common mode) such that a switching point of the NMOS gm stage can be decreased and the gm stage can be activated within a reduced time.

The above and other preferred features, including various novel details of implementation and combination of elements, will now be more particularly described with reference to the accompanying drawings and pointed out in the claims. It will be understood that the particular methods and apparatuses are shown by way of illustration only and not as limitations. As will be understood by those skilled in the art, the principles and features explained herein may be employed in various and numerous embodiments.

BRIEF DESCRIPTION OF THE DRAWINGS

The disclosed embodiments have advantages and features which will be more readily apparent from the detailed description, the appended claims, and the accompanying figures (or drawings). A brief introduction of the figures is below.

FIG. 5 illustrates an exemplary process of configuring and implementing a transmitter with a common mode controlled serialization stage embedded in an output stage.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Figure 1:
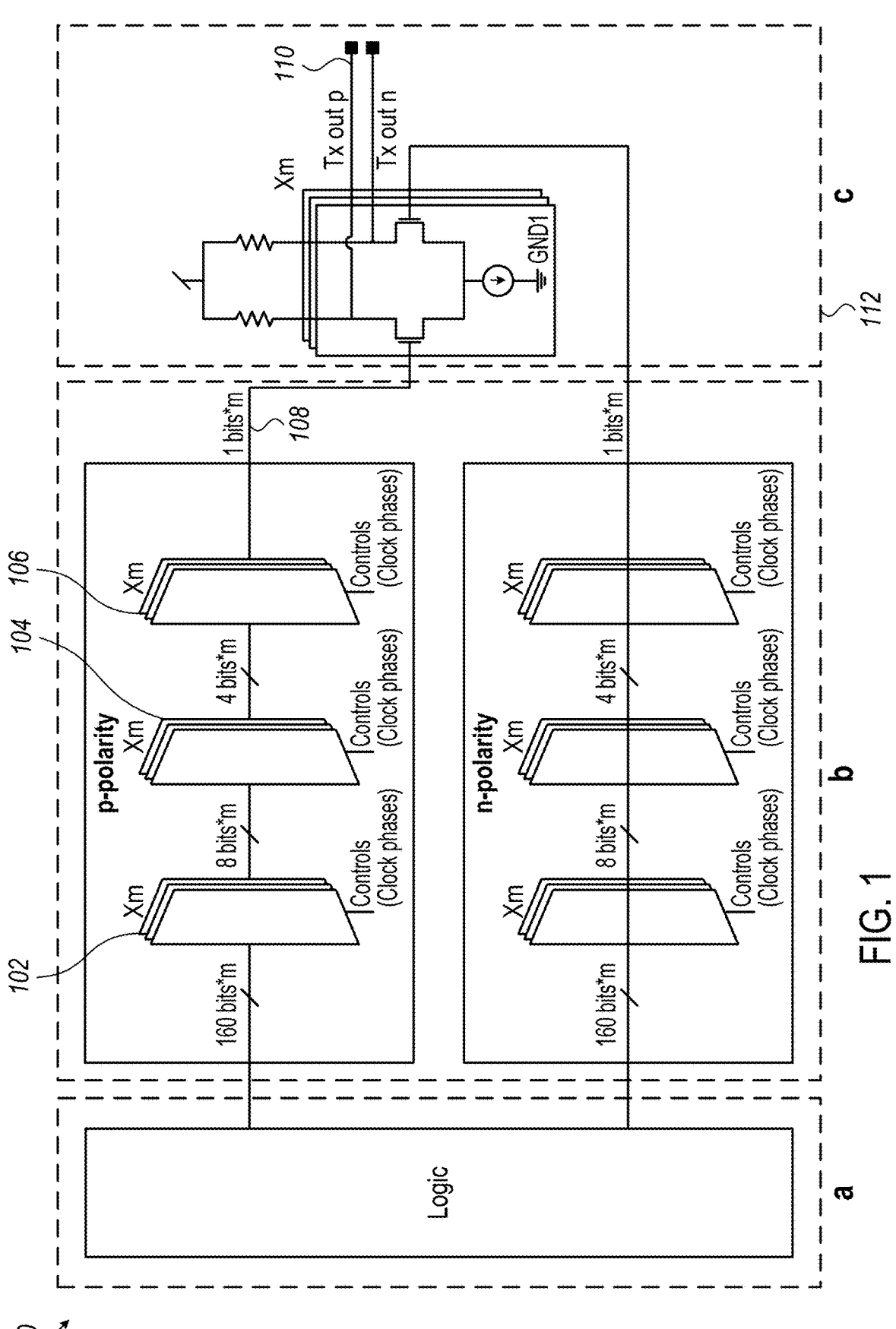
FIG. 1 illustrates an exemplary topology of a digital-to-analog converter (DAC) of a Tx, according to some embodiments.

FIG. 1 illustrates an exemplary topology 100 of a DAC-based Tx. It should be noted that, while a DAC-based Tx is presented, the system and approach described herein in this disclosure are not limited to the DAC based Tx topology only, but to all Tx topologies that use an analog output driver. The example DAC-based Tx in FIG. 1 includes three portions (a), (b), and (c). In FIG. 1(*a*), a logic portion or a data acquisition circuit generates the data that the Tx transmits. In this example, the data is generated in m parallel branches or links.

The data generated in m parallel branches has a data rate that is significantly lower (e.g., 160× slower as in FIG. 1) than the TX's data rate. As described above, due to this low-speed data generation from the logic portion, the Tx often uses PISO to increase the data rate. PISO allows the data to be converted from a parallel format to a serial format. Data is loaded in a parallel format to the Tx, meaning that the data bits are generated and presented simultaneously in multiple low-speed branches (e.g., individual wires). Data is then outputted after serialization, meaning that the data bits are outputted sequentially in time on a single wire or branch. In other words, PISO conversion may allow the data received in parallel to be stored, shifted on a clock basis, and delayed by the number of stages times the clock period until a single sequence of data is obtained. FIG. 1(b) shows the PISO or serialization, in which the data with a lower rate is serialized to reach the required higher data rate for the Tx.

As depicted in FIG. 1(b), the serialization process can be implemented by a chain of multiplexers, e.g., mux 102, 104, and 106. Each mux is controlled by clock phases such that correct data can be routed to the output at an appropriate time. The outcome of the serialization process is a single signal with a high frequency. Unfortunately, this topology (mainly the last mux) is limited in speed, which often cannot satisfy the Tx's speed requirement. The present system described herein addresses the speed limitation issue and dramatically improves system performance.

In some embodiments, once the data was serialized, an output stage 112 is driven to convert the inputted serialized data 108 to an analog signal 110, as shown in FIG. 1(c).

In a non-return-to-zero (NRZ) Tx, each analog symbol is represented by a single logic bit. But in a DAC based Tx and when equalization is used, each analog symbol may include multiple digital bits, where the combination of digital bits creates an analog symbol. As can be seen in FIG. 1, an analog symbol 110 may be generated by m analog stages, where m is a positive integer. In this example, the m analog stages are trans-conductance (gm) stages. The analog or gm stages 112 are fed with the digital data 108. The output of the analog/gm stages is shorted to a common resistor load, which then creates the analog symbol 110 as shown in FIG. 1(c). In contrast, an NRZ Tx has only a single gm stage since each analog symbol is represented by a single bit.

An approach to implementing serialization is shown in FIG. 1, e.g., FIG. 1(b). The serialization is performed in multiple chained stages. When the amount of parallel data branches decreases in the following stage (e.g., mux 104 works following mux 102), the data rate increases. The amount of parallel data branches continues to decrease until the serialization progresses to the last serialization stage, where the remaining parallel data branches get serialized to one single data branch with a high data rate (e.g., 108). This last serialization stage is the most challenging since it operates at the highest speed.

Figure 2:
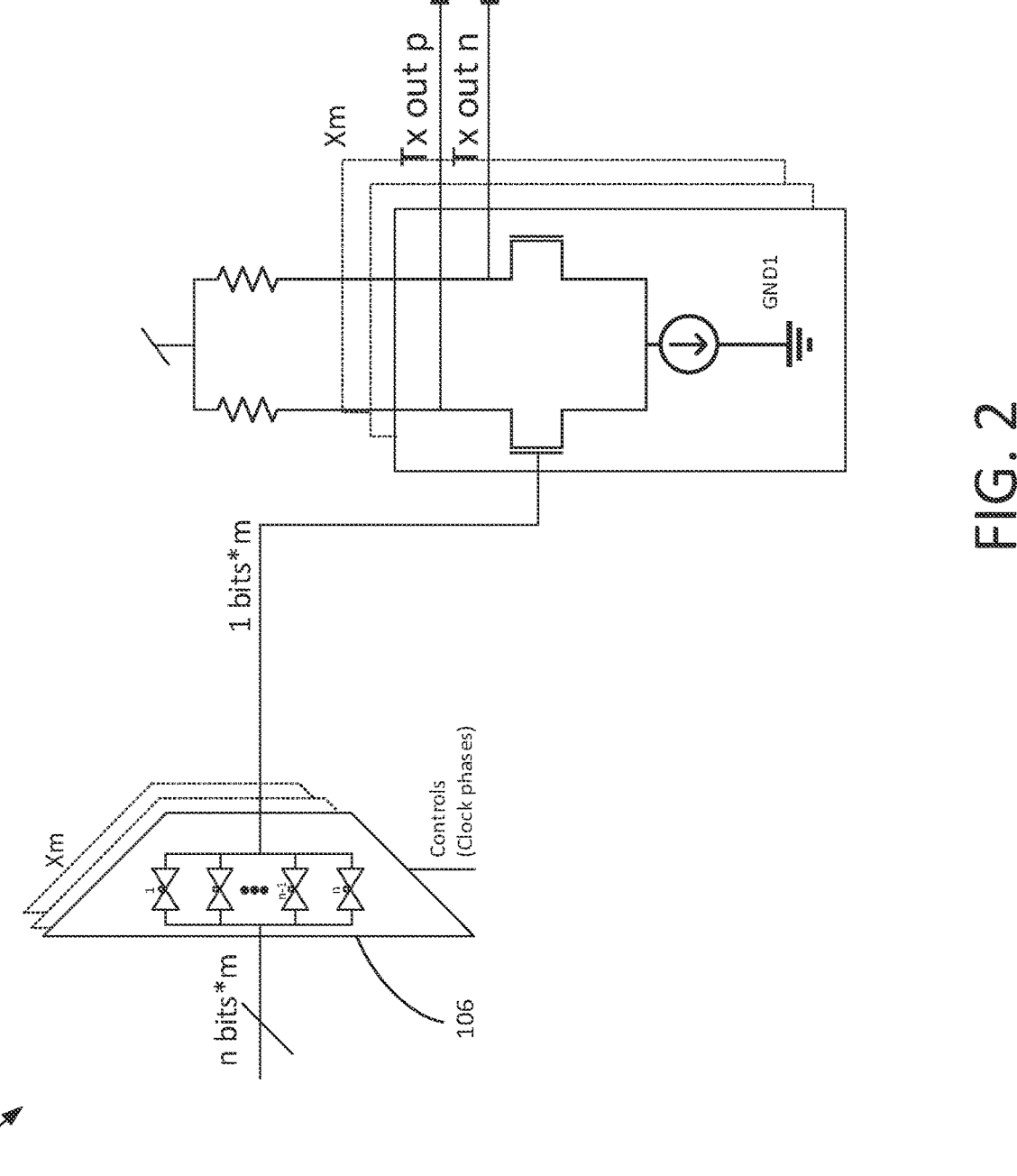
FIG. 2 illustrates an exemplary n:1 stage load, according to some embodiments.

In some embodiments, the load of the last PISO or serialization stage is its other "off" branches and a followed analog buffer. FIG. 2 illustrates the last serialization stage 200 of FIG. 1. This stage includes an "n to 1" or n:1 mux, e.g., 4:1 mux 106 as shown in FIG. 1(b). The n:1 mux has n−1 "off" passgates (e.g., n−1 branches that are switched off) and one gm stage. This load is typically too heavy to support a high speed data rate as existent in cutting-edge Txs. For example, a fin field-effect transistor (FinFET) based Tx can handle data at a speed over 10s gigahertz (GHz). It should be noted that this speed issue exists in both NRZ and DAC base topologies in the same way. Therefore, although the solution for the speed issue is described herein in the context of DAC base topologies, it is also applicable in NRZ as well as other topologies.

One conventional way to reduce the load and reach the required bandwidth is to reduce the size of transistors. This, however, will cause signals to be attenuated. The attenuated signals need to be compensated by a large amount of power consumption, which further causes significant reliability issues.

Figure 3:
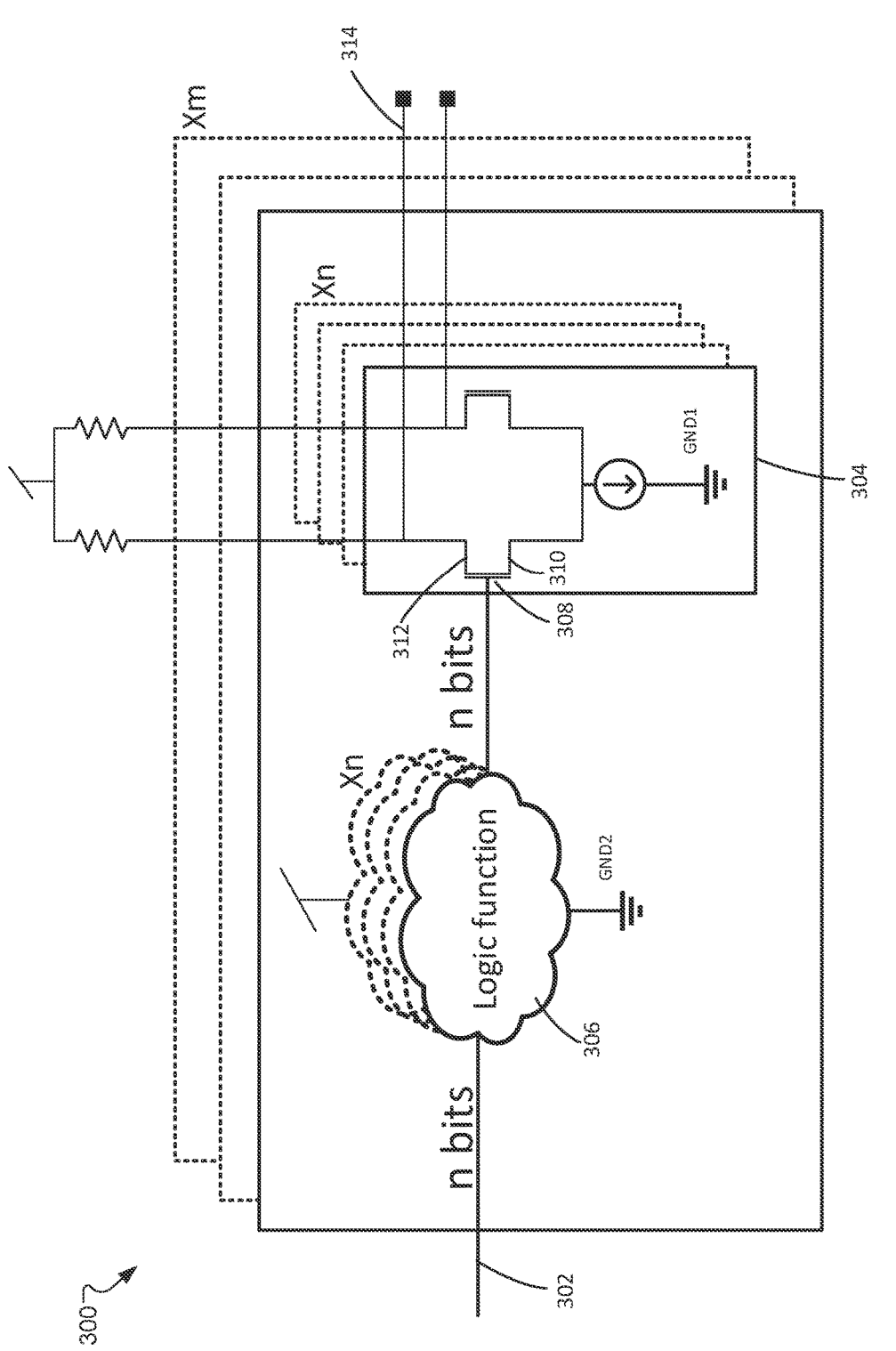
FIG. 3 illustrates an exemplary n:1 circuit used for reducing data load and increasing data processing speed, according to some embodiments.

FIG. 3 illustrates an example n:1 (e.g., 4:1) circuit structure 300. This structure is an improved configuration of the last PISO stage in FIG. 1. As depicted in FIG. 3, in some embodiments, the speed restriction issue of the last PISO stage may be addressed by connecting each input 302 of the last PISO stage to a dedicated analog stage 304 (e.g., gm stage) through a logic function or cell 306. The input 302 is connected to the analog stage 304 with a relevant clock phase (not shown), such that it can be activated at an appropriate time. The logic function, for example, can be an "AND" function between the input 302 with the relevant clock phase. As shown above in FIGS. 1(b) and 2, the last PISO stage is the 4:1 mux 106. Using this 4:1 mux as an example, in FIG. 3, four bits input of the 4:1 mux 106 can be connected to four logic functions and four gm stages. This appears m times because of the example DAC topology in FIG. 1. The structure of FIG. 3 may reduce the data load and increase the processing speed. In addition, connecting each bit to a dedicated analog stage allows gain mismatch calibration to each bit.

As shown in FIG. 3, transistors can be used to amplify or switch electrical signals and power. A transistor usually includes at least three terminals (e.g., 308, 310, and 312) for connection to an electronic circuit. When a voltage is applied, it can control the current through a pair of terminals. For example, when a voltage is applied to the gate 308 of a transistor, it creates an electric field that controls the flow of charge carriers (e.g., electrons) between the source 310 (e.g., the terminal in which the current enters the transistor) and drain 312 (e.g., the terminal in which the current exits the transistor). Because the output power can be higher than the controlling or input power, a transistor can amplify a signal to obtain output signal 314.

When using a gm stage for the analog stage, the voltage of the input pair's source is the drain voltage of the current source, i.e., the $V_{ds}$ of the current source. This indicates that, to operate the gm stage, the gate voltage should be higher than the sum of the current source voltage $V_{ds}$ and the transistor's $V_t$. Since the logic function/cell 306 toggles between ground ($V_{ss}$) to the supply voltage ($V_{dd}$), it may take some time to charge the gate 308 from $V_{ss}$ to the voltage of $V_{ds}+V_t$, which turns on the analog stage. This gate charging time is not negligible for cutting-edge Tx systems, thereby adversely affecting the Tx's performance on speed, gain, efficiency, etc.

Figure 4:
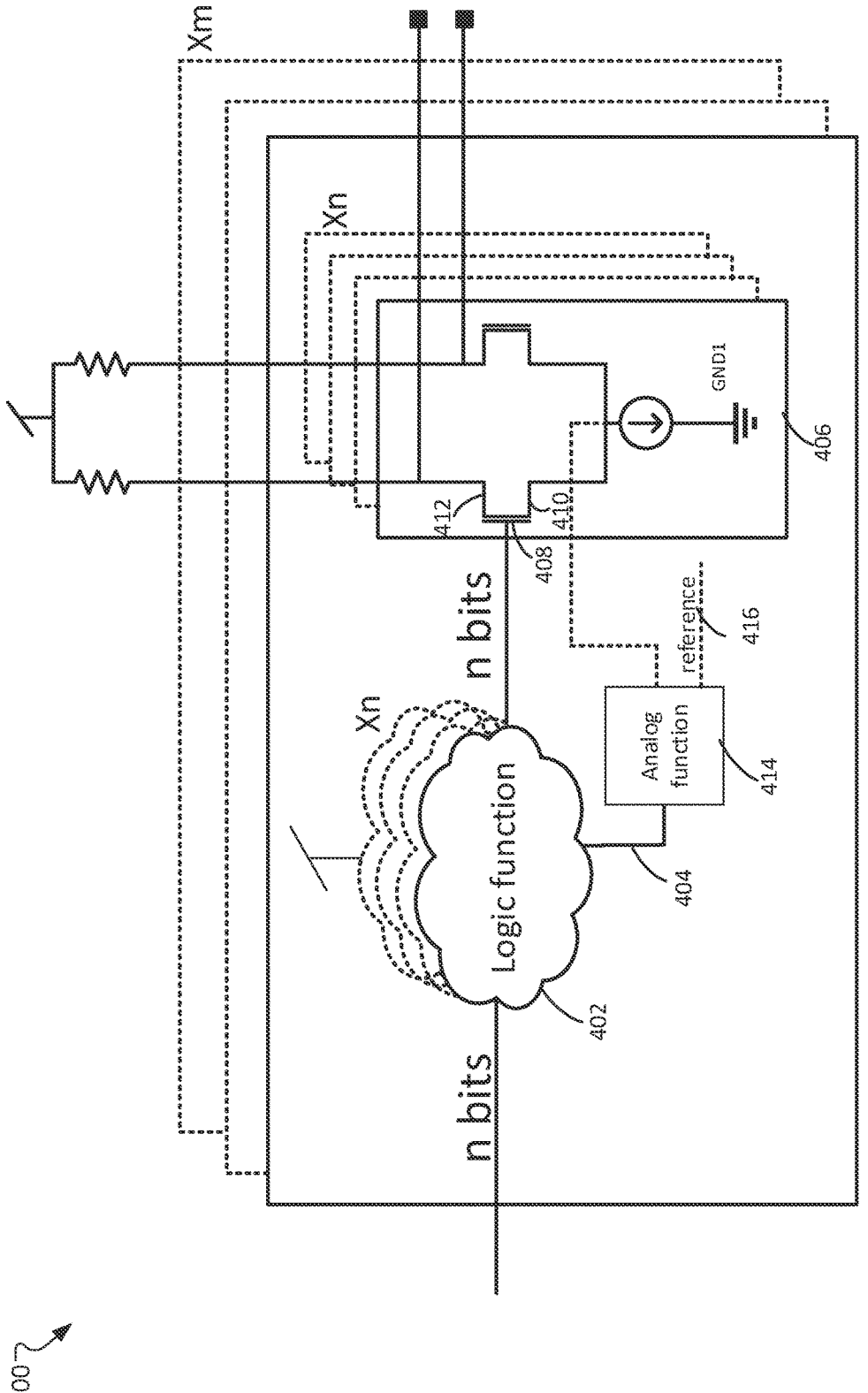
FIG. 4 illustrates an exemplary n:1 circuit where the ground of a logic circuit is controllable, according to some embodiments.

The transmitter topology in the present disclosure is further improved to address this drawback, as explained with reference to FIG. 4. Specifically, the ground of the logic circuit is controllable and thus can easily be raised to approximate to the switching point of the NMOS gm stage. In the scenario of FIG. 4, the ground of the logic circuit/function 402, which drives the analog output circuit/cell, is not $V_{ss}$. Rather, the logic circuit's ground is derived from the analog circuit's common mode, as shown in 404. This indicates that the output of logic circuit 402 will be toggled around the switching point of the analog circuit 406. A switching point is the point (e.g., a specific voltage value) that the circuit of the analog output stage 406 is turned on. As a result, the analog circuit can be activated much faster, and the conducting period of the analog circuit can be longer.

In the present system, the analog stage or analog output stage is implemented with NMOS devices/transistors, i.e., the analog gm stage is NMOS-based stage. A NMOS transistor or NMOS refers to a n-channel metal oxide semiconductor (MOS) field effect transistor (MOSFET). A NMOS transistor may include three terminals, such as a gate 408, source 410, and drain 412 as shown in FIG. 4. The NMOS transistor is turned on (e.g., open) when the gate voltage is above the source voltage plus a threshold voltage. If the ground of the logic circuit 402 is set to zero, its output toggles between zero to the supply voltage $V_{dd}$. In such a case, in order to activate the analog gm stage 406, i.e, to turn on the NMOS transistor, the gm's gate voltage has to be raised from zero to the sum of transistor's $V_t$ and the voltage of the current source $V_d$, i.e., $V_d + V_t$. This rising time may be too long for an efficient transmitter operation. As shown in FIG. 4, the present system derives the ground of the logic circuit 402 from the common mode of the analog circuit 406 through an analog function 414. That is, the logic function's ground is configured to be close to a specified desired voltage, for example, $V_d$. As a result, the analog gm stage 406 can be activated when the gate voltage is raised only by $V_t$. This significantly shortens the stage activation time, thereby enabling the analog stage to operate much faster and improving operation efficiency.

Another feature of the topology shown in FIG. 4 is to use an external reference voltage 416. This external reference voltage 416 can be used to force the input common mode of analog stage 406 to be any desired voltage. In addition, the external reference voltage 416 can ensure that the current source stay in a saturation mode. Moreover, since the external reference voltage 416 controls the ground, it can be further used to determine the digital circuit's output range. The use of the external reference voltage therefore can increase the transmitter speed and gain, obtain the desired current, and improve the common-mode rejection ratio (CMRR).

System Flowchart

The present system discloses a transmitter topology with a common mode controlled serialization stage embedded in an output stage, which not only increases the operation speed but also improves the transmitter gain, stability, etc. To achieve these technical advancements, the present system includes some distinct features. The present transmitter system uses a unique gm stage for each bit in the last serialization stage such that the speed limitation associated with the last stage can be eliminated. This unique connection feature alone may resolve the speed issue existent in various types of transmitters (e.g., DAC transmitters, NRZ transmitters). In addition, the present transmitter system uses NMOS based gm stages to generate an analog signal. In particular, the ground of the logic circuit, which drives the NMOS based gm stages of the analog circuit, is derived from the analog circuit's common mode. Therefore, to turn on the NMOS transistor and thus activate the analog gm stage, the gm's gate voltage is raised only by $V_t$ instead of by $V_d + V_t$. This reduces the activation time of the gm stage, which speeds up gm stage operations and further improves transmitter performance.

FIG. 5 illustrates an exemplary process 500 for configuring and implementing a transmitter with a common mode controlled serialization stage embedded in an output stage. In some embodiments, the transmitter includes a data acquisition circuit, a serialization circuit, a logic circuit, and an output circuit that are electrically and communicatively connected to work in a fast and reliable manner.

In some embodiments, the transmitter can be a DAC transmitter, an NRZ transmitter, etc. In the context of a DAC transmitter, the data acquisition circuit may generate or collect digital data associated with a plurality of data branches. The serialization circuit and the logic circuit may receive the data in parallel from these data branches and convert the received data into a single sequence of data for the output circuit to generate a signal, e.g., an analog signal.

At step 505, data from the plurality of data branches are received at the serialization circuit. The serialization circuit may include one or more serialization stages, as depicted in FIG. 1(*b*). The last stage of the serialization stages, e.g., implemented by 4:1 mux in FIG. 1(*b*), often lacks the ability to handle a big load of data with a required high data rate, thereby causing performance deterioration.

At step 510, the logic circuit connects each input of the last stage, via a respective logic function, to a respective dedicated output stage of the output circuit. For example, if the last stage is a 4:1 mux, four bits of data are connected to four logic functions and four gm stages. In this way, the data load is reduced, and the processing speed is increased.

At step 515, the output circuit implements output stages to generate a signal based on the received input using NMOS. In some embodiments, the output stages are NMOS based gm stages. The ground of the logic circuit is configured to be a desired voltage value, for example, the output circuit's common mode. By deriving the logic circuit's ground from the output circuit's common mode, a switching point of the NMOS gm stage is decreased such that the gm stage can be activated within a reduced time, thereby further speeding up the transmitter operations. In some embodiments, each output stage is fed with digital data and output to a common resistor load to generate an analog symbol.

Additional Considerations

In some implementations, at least a portion of the approaches described above may be realized by instructions that upon execution cause one or more processing devices to carry out the processes and functions described above. Such instructions may include, for example, interpreted instructions such as script instructions, or executable code, or other instructions stored in a non-transitory computer readable medium. The storage device 830 may be implemented in a distributed way over a network, for example as a server farm or a set of widely distributed servers, or may be implemented in a single computing device.

Although an example processing system has been described, embodiments of the subject matter, functional operations and processes described in this specification can be implemented in other types of digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible nonvolatile program carrier for execution by, or to control the operation of, data processing apparatus. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "system" may encompass all kinds of apparatus, devices, and machines for processing data, including by way of example a programmable processor, a computer, or multiple processors or computers. A processing system may include special purpose logic circuitry, e.g., an FPGA (field programmable gate array) or an ASIC (application specific integrated circuit). A processing system may include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a standalone program or as a module, component, subroutine, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Computers suitable for the execution of a computer program can include, by way of example, general or special purpose microprocessors or both, or any other kind of central processing unit. Generally, a central processing unit will receive instructions and data from a read-only memory or a random access memory or both. A computer generally includes a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's user device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship between client and server arises by virtue of computer programs running on the respective computers and having a client-server relationship to each other.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous. Other steps or stages may be provided, or steps or stages may be eliminated, from the described processes. Accordingly, other implementations are within the scope of the following claims.

The phraseology and terminology used herein is for the purpose of description and should not be regarded as limiting.

The term "approximately", the phrase "approximately equal to", and other similar phrases, as used in the specification and the claims (e.g., "X has a value of approximately Y" or "X is approximately equal to Y"), should be understood to mean that one value (X) is within a predetermined range of another value (Y). The predetermined range may be plus or minus 20%, 10%, 5%, 3%, 1%, 0.1%, or less than 0.1%, unless otherwise indicated.

The indefinite articles "a" and "an," as used in the specification and in the claims, unless clearly indicated to the contrary, should be understood to mean "at least one." The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of or "exactly one of," or, when used in the claims, "consisting of," will refer to the inclusion of exactly one element of a number or list of elements. In general, the term "or" as used shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The use of "including," "comprising," "having," "containing," "involving," and variations thereof, is meant to encompass the items listed thereafter and additional items.

Use of ordinal terms such as "first," "second," "third," etc., in the claims to modify a claim element does not by itself connote any priority, precedence, or order of one claim element over another or the temporal order in which acts of a method are performed. Ordinal terms are used merely as labels to distinguish one claim element having a certain name from another element having a same name (but for use of the ordinal term), to distinguish the claim elements.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A transmitter comprising:
a serialization circuit configured to convert parallel data into serial data with one or more serialization stages;
a logic circuit electrically coupled to the serialization circuit and an output circuit, the logic circuit configured to connect each input of a last stage of the one or more serialization stages of the serialization circuit, via a respective logic function, to a respective dedicated NMOS based trans-conductance (gm) output stage of the output circuit; and
the output circuit configured to implement output stages to generate a signal based on the received input using n-channel metal oxide semiconductor (NMOS) field effect transistors, wherein:
a ground of the logic circuit is configured to be a desired voltage value so as to decrease a switching point of the gm output stage of the output circuit, such that the gm output stage can be activated within a reduced time,
the switching point is a threshold voltage value at which a NMOS transistor is turned on, and
the desired voltage value includes a common mode of the output circuit.

2. The transmitter of claim 1, wherein:
the serialization circuit includes a series of multiplexers in the one or more serialization stages,
the last serialization stage is a multiplexer having a plurality of inputs, and
the logic circuit is configured to connect a plurality of bits input from the last serialization stage to a plurality of gm stages through a plurality of logic functions.

3. The transmitter of claim 2, wherein the input of the last serialization stage is connected to the respective output stage with a relevant clock phase.

4. The transmitter of claim 3, wherein the serialization circuit and the output circuit are connected by the logic circuit in a way that reduces data load of the last serialization stage and increases operation speed of the transmitter.

5. The transmitter of claim 1, wherein each output stage is fed with digital data and output to a common resistor load to generate an analog symbol.

6. The transmitter of claim 1, further comprising:

a data acquisition circuit configured to generate the parallel data in a plurality of data branches, wherein the serialization circuit and the logic circuit are configured to convert the parallel data received from the plurality of data branches into a single sequence of data.

7. The transmitter of claim 1, wherein the transmitter is one of a digital-to-analog converter (DAC) based transmitter, a non-return-to-zero (NRZ) transmitter, or other types of transmitters.

8. The transmitter of claim 1, wherein the logic circuit is connected to an external reference voltage and adjusted to enable a current source to operate in saturation.

9. A method for configuring and implementing a transmitter, comprising:

receiving, by a serialization circuit, data in parallel from a plurality of data branches, the serialization circuit including one or more serialization stages;

connecting each input of a last stage of the one or more serialization stages, via a respective logic function of a logic circuit, to a respective dedicated NMOS based trans-conductance (gm) output stage of an output circuit; and implementing, by the output circuit, output stages to generate a signal based on the received input using n-channel metal oxide semiconductor (NMOS) field effect transistors, wherein:

a ground of the logic circuit is configured to be a desired voltage value so as to decrease a switching point of the gm output stage of the output circuit, such that the gm output stage can be activated within a reduced time, the switching point is a threshold voltage value at which a NMOS transistor is turned on, and the desired voltage value includes a common mode of the output circuit.

10. The method of claim 9, further comprising:

configuring a series of multiplexers in the one or more serialization stages of the serialization circuit, wherein the last serialization stage is a multiplexer having a plurality of inputs, and connecting, by the logic circuit, a plurality of bits input from the last serialization stage to a plurality of gm stages through a plurality of logic functions.

11. The method of claim 10, wherein the input of the last serialization stage is connected to the respective output stage with a relevant clock phase.

12. The method of claim 11, wherein the serialization circuit and the output circuit are connected by the logic circuit in a way that reduces data load of the last serialization stage and increases operation speed of the transmitter.

13. The method of claim 9, wherein each output stage is fed with digital data and output to a common resistor load to generate an analog symbol.

14. The method of claim 9, further comprising:

generating the data in the plurality of data branches, and converting the data received in parallel from the plurality of data branches into a single sequence of data.

15. The method of claim 9, wherein the transmitter is one of a digital-to-analog converter (DAC) based transmitter, a non-return- to-zero (NRZ) transmitter, or other types of transmitters.

16. The method of claim 9, further comprising:

connecting the logic circuit to an external reference voltage; and adjusting the logic circuit to enable a current source to operate in saturation.

\* \* \* \* \*